(12) United States Patent
Sayegh (10) Patent No.: US 6,195,165 B1
(45) Date of Patent: Feb. 27, 2001

(54) ENHANCED SENSOR

(75) Inventor: Namir Sayegh, Minneapolis, MN (US)

(73) Assignee: CyberOptics Corporation, Golden Valley, MN (US)

( * ) Notice: Subject to any disclaimer, the term of this patent is extended or adjusted under 35 U.S.C. 154(b) by 0 days.

(21) Appl. No.: 09/368,017

(22) Filed: Aug. 3, 1999

Related U.S. Application Data (60) Provisional application No. 60/095,276, filed on Aug. 4, 1998.

(51) Int. Cl.[7] ................................................. G01B 11/24
(52) U.S. Cl. .............................................. 356/376; 375/400
(58) Field of Search .................................. 356/376, 375; 356/400

(56) References Cited

U.S. PATENT DOCUMENTS

| | | | |
|---|---|---|---|
| 3,614,237 | 10/1971 | Kyle et al. | 356/120 |
| 3,627,427 | 12/1971 | Johnson et al. | 356/120 |
| 3,762,818 | 10/1973 | Johnson et al. | 356/120 |
| 4,762,578 | 8/1988 | Burgin, Jr. et al. | 156/64 |
| 5,377,405 | 1/1995 | Sakurai et al. | 29/833 |
| 5,384,956 | 1/1995 | Sakurai et al. | 29/834 |
| 5,491,888 | 2/1996 | Sakurai et al. | 29/832 |
| 5,570,993 | 11/1996 | Onodera et al. | 414/783 |
| 5,608,642 | 3/1997 | Onodera | 364/478.01 |
| 5,619,328 | 4/1997 | Sakurai | 356/375 |
| 5,741,114 | 4/1998 | Onodera | 414/783 |
| 5,907,282 | 6/1999 | Onodera | 414/783 |

FOREIGN PATENT DOCUMENTS

| | | |
|---|---|---|
| 4-211839 | 8/1992 | (JP) . |
| 6-18215 | 1/1994 | (JP) . |
| 7-193396 | 7/1995 | (JP) . |
| 7-202495 | 8/1995 | (JP) . |
| 8-111598 | 4/1996 | (JP) . |
| 2554437 | 8/1996 | (JP) . |
| 8-228097 | 9/1996 | (JP) . |
| 2600044 | 1/1997 | (JP) . |
| 9-21609 | 1/1997 | (JP) . |
| 2659651 | 6/1997 | (JP) . |
| 11-74700 | 3/1999 | (JP) . |

*Primary Examiner*—Frank G. Font
*Assistant Examiner*—Reginald A. Ratliff
(74) *Attorney, Agent, or Firm*—Westman, Champlin & Kelly, P.A.

(57) ABSTRACT

A single housing sensor includes a detector in the housing receiving light from a light source. A detector in the housing provides an output representative of a profile of a component which is rotatably mounted on a nozzle of the pick and place machine. The sensor also includes a receiving circuit in the housing coupled to an encoder in the pick and place machine, the encoder providing an output representative of the rotational position of the nozzle to the sensor. Computing circuitry in the sensor computes a correction signal representative of the pick-up offset of the component and of the orientation angle of the component. The correction signal is computed from the motor encoder data and from a plurality of images of the shadow of the component, each image collected at a rotational angle, $\theta$, of the nozzle. A UART serially sends the correction signal to the pick and place machine, for use in placing the component precisely onto a printed circuit board.

19 Claims, 7 Drawing Sheets

ENHANCED SENSOR

PRIORITY CLAIM

The present application relates to a provisional patent application filed by the present assignee on Aug. 4, 1998 titled "Enhanced Sensor", having a patent application Ser. No. 60/095,276.

COPYRIGHT RESERVATION

A portion of the disclosure of this patent document contains material which is subject to copyright protection. The copyright owner has no objection to the facsimile reproduction by anyone of the patent or the patent disclosure, as it appears in the Patent and Trademark Office, patent file or records, but otherwise reserves all copyright rights whatsoever.

FIELD OF THE INVENTION

This invention relates to optical sensor systems for determining a location or orientation of an object, such as an electronic component, including such systems which report a physical condition of the object, such as reporting "lead tweeze" on an electronic component, the height of a particular feature on the object, the distance between features on the object, or the presence and absence of expected features on the object.

BACKGROUND OF THE INVENTION

General Background

There are many optical based approaches to identifying various parameters related to an object, such as an electronic component. The various parameters which may be reported include angular orientation of the component, location of features on the component (e.g., pick-up off-set), indication of the quality of the component, such as a bent lead (lead tweeze) in the case of a Quad Flat Pack (QFP) component, or a measurement of a feature located on the bottom of the component, such as height of a ball on a Ball Grid Array (BGA) component. The system for identifying these parameters is generally mounted in a pick and place machine which picks up the component and places the component onto a printed circuit board after determining proper orientation and pick-up offset of the component. All of these approaches rely on a quill in the pick and place machine to pick up the component and all generally utilize the motion control system in the pick and place machine in the measurement process. Some of the approaches use cameras to collect data representative of an image of the component and others collect data representative of an outline of the component. All have some sort of processor that analyzes the collected data in order to identify some specific portion of the component, such as the edges of the part or tips of the component leads.

The word "orientation" used with respect to an object, and forms thereof, will be used throughout this document to indicate the angular position of the object with respect to a reference. The word "location" used with respect to an object, and forms thereof, will be used throughout this document to indicate the (x,y) position of the object with respect to a nominal (x,y) reference location.

Different types of placement methodologies are now in use in pick and place machines as well. In general, pick and place machines can be characterized as being either "on-head" or "off-head". On-head sensor systems (considered together with their host pick and place machines) sense and correct for the orientation and pick-up offset of the component while the component travels to the target circuit board. On-head systems are preferred as they minimize the amount of time to place a component on a board, thereby increasing the throughput of the pick and place machine. Off-head sensor systems perform the data collection in a fixed location on the pick and place machine. With an off-head system, the quill must first move the component to a dedicated station and after acquiring the image, move the component to the target circuit board for placement. Off-head systems typically reduce throughput of the machine since the head makes additional stops or travels further, but are used because they are inexpensive, reduce the mass which must be carried on the head and one sensor can readily service multiple quills.

The essential purpose of a pick and place machine is to place an electronic component on a printed circuit board. Regardless of the type of sensor used to precisely locate certain features on the component, the host processor in the pick and place machine has an intended placement spot for the component. The location information from the sensor, vision camera or otherwise, is typically sent via a RS-422 port back to the host processor. Based on the sensor output and the desired placement position of the component, the host processor computes an orientation correction (x,y,$\theta$) which includes an angular correction ($\theta$) and a pick-up offset (x,y). Based on the orientation correction signal, the host processor instructs the motion control system in the pick and place machine to implement this correction movement, the motion control system responds, and then the host processor instructs the pick and place machine to place the component.

Figure 1:
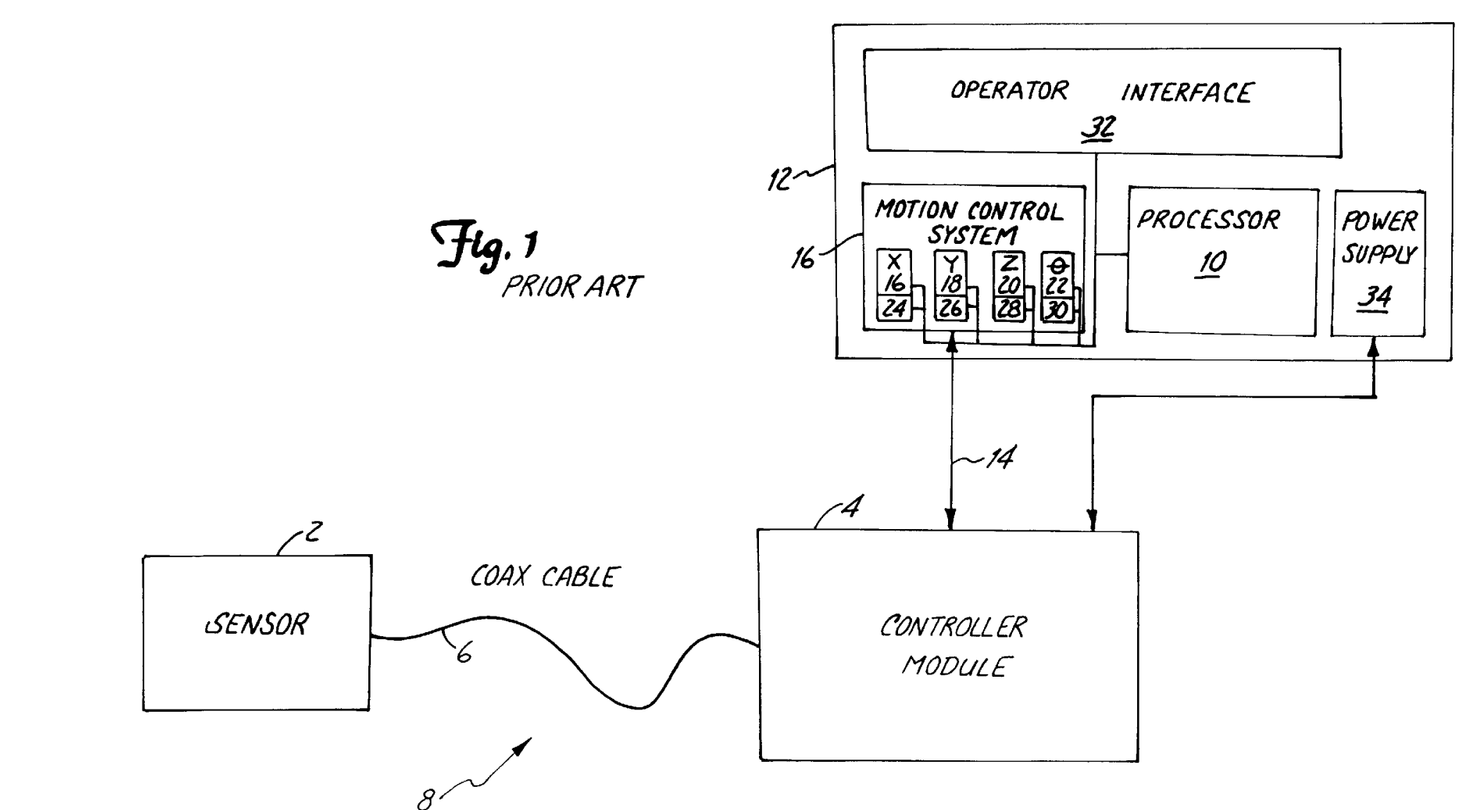
FIG. 1 is a prior art block drawing showing a sensor head, a controller module and a pick and place machine.
Figure 2:
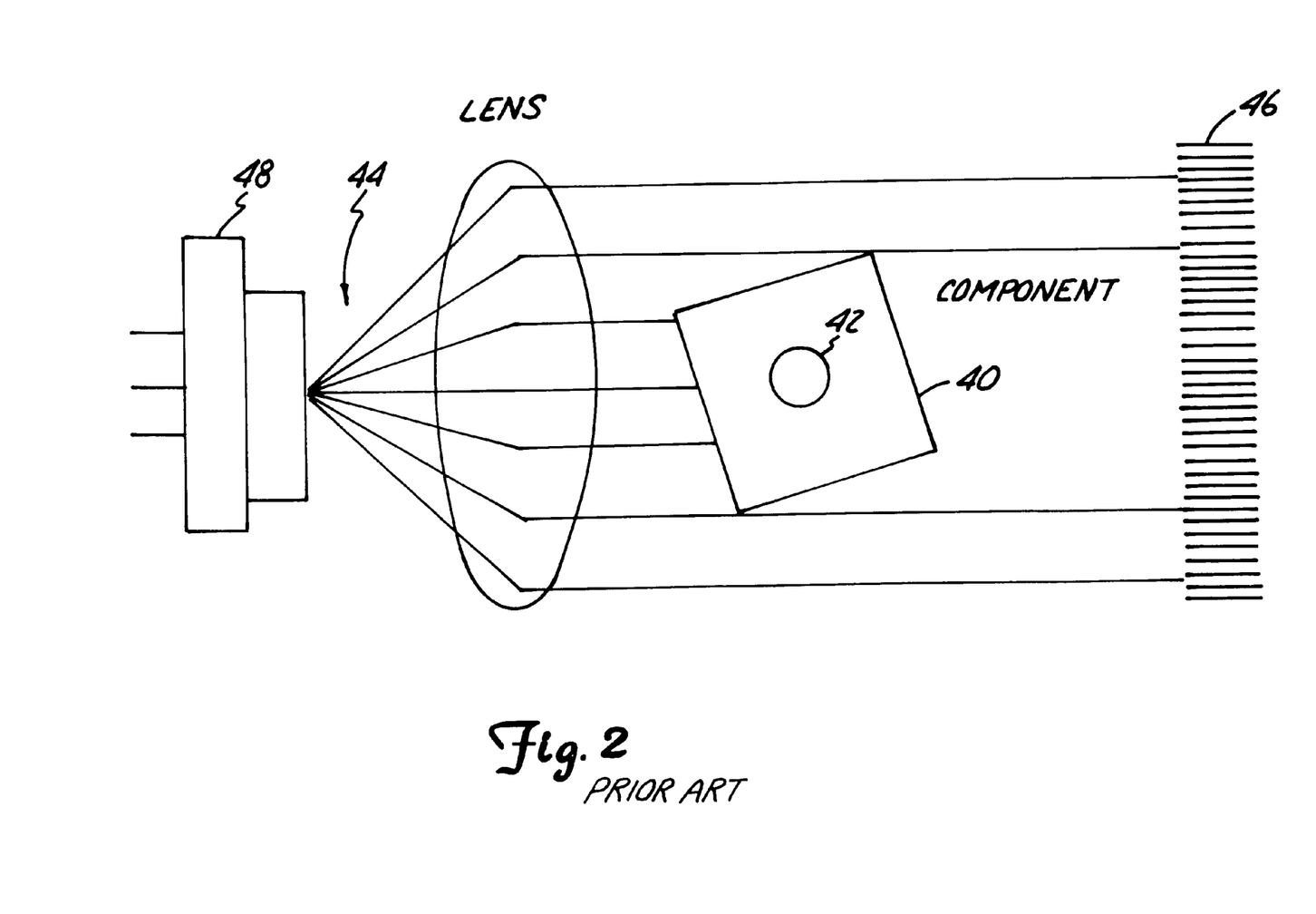
FIG. 2 is a sketch of the method of operation of a LaserAlign® sensor, showing a component rotating in light and a shadow of the component shown on the detector.

The electronic block diagram and general operational principles of a prior art shadow cast based sensor 2 and a prior art pick and place machine 12 is shown in FIGS. 1–2. A sensor system 8 consists of three parts; the sensor 2 (located on a sensor head, not shown), a controller module 4 and a two-wire coaxial cable 6 which connects sensor 2 to controller module 4. Sensor 2 is located on the sensor head of pick and place machine 12, while controller module 4 is located in a separate electronic enclosure, or alternatively, within machine 12. Operation of the system 8 is controlled by a processor 10 in pick and place machine 12, which generally controls the operation of machine 12 and issues commands to controller module 4 over communications bus 14, typically in a serial communications protocol of RS-232 or RS-422. A motion control system 16 controls x,y,z,$\theta$ movement of the sensor head via motors 16, 18, 20 and 22, respectively. Each motor has an associated encoder 24, 26, 28 and 30, respectively, each encoder adapted to independently output a signal representative of the change in x,y,z and $\theta$ position of the sensor head in pick and place machine 12. Pick and place machine 12 also includes an operator interface 32 which typically includes a CRT for viewing images of the component provided by the present invention, or optionally viewing summary results of operations of machine 12. A power supply 34 is located in pick and place machine 12, and supplies all the operating power required by sensor 2 over the bus 14, through controller module 4 and over two wire coaxial cable 6 to sensor 2.

The general operation of shadow cast sensor 2 is best explained in FIG. 2. A component 40 is secured via a vacuum nozzle 42 or the like to sensor head (not shown). A plurality of light rays 44 are cast onto component 40 from one of its sides and a linear image detector 46 on the other side of component 40 captures data representative of the shadow of component 40. Sensor 2 is shown with a laser diode source 48 for light 44, but any sort of high intensity light source may be used, regardless of whether the light is coherent or not. At several pre-selected angular positions of rotary motor 22, the sensor 2 collects data from the detector representative of the shadow of component 40. As appropriate for the type of component, the pre-selected angular positions do not have to be equally spaced over 360 degrees nor is component 40 required to spin at a constant angular velocity. For each preselected angular position, electronics in controller module 4 compute the width of the component's shadow on the detector and the location of shadow's center. For a rectangular component angularly rotated 180 degrees, a plot of shadow width v. angle will produce two minima; one corresponding to the width of the component and one corresponding to its length. Once the two minimum widths and their corresponding angles and shadow centers are known, the location of a feature on component 40 (with respect to an internal (x,y) reference in the pick and place machine) may be computed. The pick-up offset is calculated once the location of a feature and the internal (x,y) reference for a pick and place machine are known. This system does not provide any further information not already derived from the shadow edges, so that it is unable to identify misplaced or missing balls on BGAs or flip-chips, and cannot identify lead position errors for leaded components such as QFPs or TSOPs. This shadow casting sensor is shown in U.S. Pat. No. 5,278,634 to Skunes et al., assigned to CyberOptics® Corporation. Other applications of a shadow cast system include allowing the light to fall on the component while it is tilted, so as to be able to discern information about the leads on a component rather than exclusively the profile. The shadow cast approach takes advantage of the motion control system already installed on pick and place machine 12, which has an extremely accurate rotary motor 22 and encoder 30 for reporting the angular position of nozzle 42.

Since there is an electronics circuit board and a sensor associated with each of the effective data channels for placing components, it is cumbersome to change the electronics board whenever a difference type sensor is installed. Furthermore, the electronics board associated with each sensor in pick and place machine requires valuable board space and additional communications overhead is associated with each additional sensor/electronics board combination. Additionally, the amount of space consumed by the combination of the cabling between the board, the sensor and the host processor (which is not typically connected to the same card cage as the sensor electronics board) is excessive and a more space efficient solution is desired. In sum, a new interchangeable sensor which would allow various sorts of sensors to be installed in a pick and place machine without excessive downtime, which also provides for more efficient use of computations and communications capability within the pick and place machine and finally, takes up a reduced amount of space, is needed.

SUMMARY OF THE INVENTION

In the most basic form of the invention, a single housing sensor includes a detector in the housing receiving light from a light source. The detector provides an output representative of a profile of the component, as it is mounted on a nozzle of the pick and place machine. The sensor also includes a receiving circuit in the housing coupled to a motor encoder in the pick and place machine, the encoder providing an output representative of the rotational position of the nozzle to the sensor. Computing circuitry in the sensor computes a width of the profile of the component at a plurality of rotational positions of the nozzle, as a function of the output from the encoder and output from the detector, the circuitry providing a value of the output of the encoder at which the width of the component is minimized, sometime called the correction signal. In a preferred embodiment of the circuitry in the sensor, a UART (Universal Asynchronous Receiver Transceiver) is used to serially send the correction signal to the pick and place machine.

The sensor of the present invention is preferably used on-head, and also off-head, in a pick and place machine. The present invention may be used with any sort of light source of sufficient intensity to provide a detectable signal from the detector, including coherent light and incoherent light. When the housing is widened to allow for additional component, as in the case of a multi-nozzle sensor, the electronics in the sensor allows for as many "channels" as there are nozzles, one channel corresponding to one nozzle. The present invention is not limited to the specific sensors, controller circuits and pick and place machines as disclosed herein. For example, the present invention can be practiced with off-head sensors which detect a position of the component via smart cameras incorporating detector and vision processing circuitry in the same physical package.

BRIEF DESCRIPTION OF THE DRAWINGS

FIGS. 6A–D show various mechanical and electrical aspects of a 4-channel sensor of the present invention, FIG. 6A showing the physical layout of the sensor; FIG. 6B showing a side cross sectional view thereof, FIG. 6C showing general operation of the sensor for one of the four channels.

For convenience, items in the figures having the same reference symbol are the same or serve the same or a similar function.

DETAILED DESCRIPTION OF THE PREFERRED EMBODIMENTS

Figure 3:
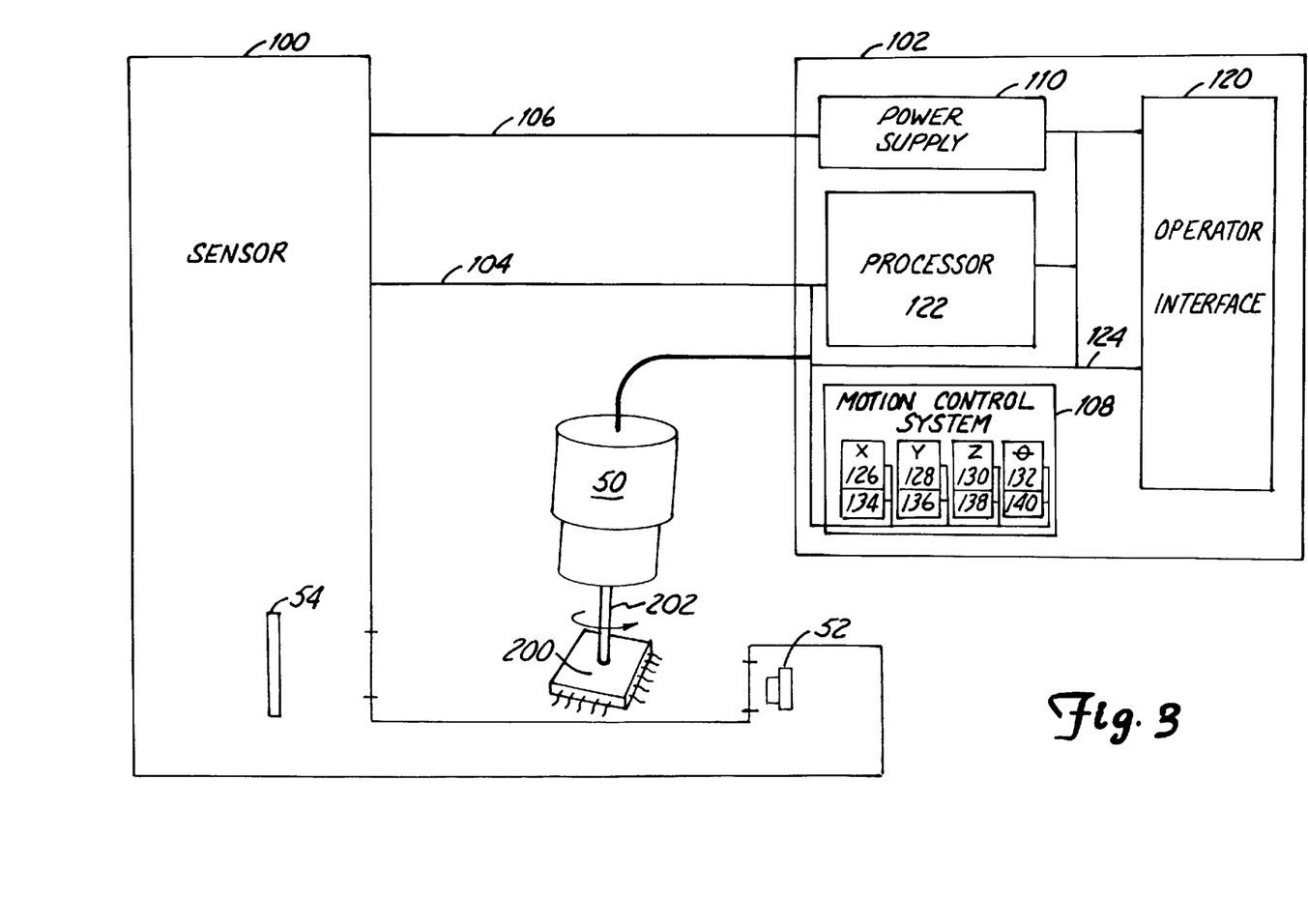
FIG.3 is a block diagram of the control loop formed between the sensor of the present invention, the pick and place machine and the component.

FIG. 3 shows a preferred embodiment of the present invention, where a shadow cast sensor 100 is connected to a pick and place machine 102 via a cable 104 and a power supply cable 106. Cable 104 carries communications and motor-encoder signals from a motion control system 108 in pick and place machine 102, and in the other direction, transmits data from sensor 100 representative of the angular orientation and (x,y) position of a part 200 on nozzle 202. Pick and place machine 102 includes a power supply 110, an operator interface 120, a processor 122 and motion control system 108. A central bus 124 connects operator interface 120 to motion control system 108, processor 122 and also to external sensor head 50. Power supply 110 supplies power to sensor 100 over cabling 106.

Motion control system 108 includes a set of motors 126, 128, 130 and 132 for moving a head 50 in pick and place machine 102 in the x, y, z and θ directions, respectively, including a set of encoders 134, 136, 138 and 140 attached to each of the respective motors to provide an output representative of the position of head 50 in the appropriate direction. As part of the data collection process for sensor 100, motion control system 108 sends instructions to sensor head 50 to angularly rotate nozzle 202 while a light 52 is energized, so as to cast a shadow of the outline of component 200 into detector 54. Light source 52 may be any type of light source as long as it has sufficient intensity to provide an adequately detectable shadow on detector 54, although a preferred embodiment is a laser diode operated so that the light is substantially coherent. Sensor 100 is a slave-like device, in that it receives operating instructions from machine 102 via bus 104, such as instructions to collect data, or specific instructions to report data about the width of the cast shadow and the associated angular position of nozzle 202. A closed loop control loop is formed between sensor 100, pick and place machine 102 and part 200.

Figure 4:
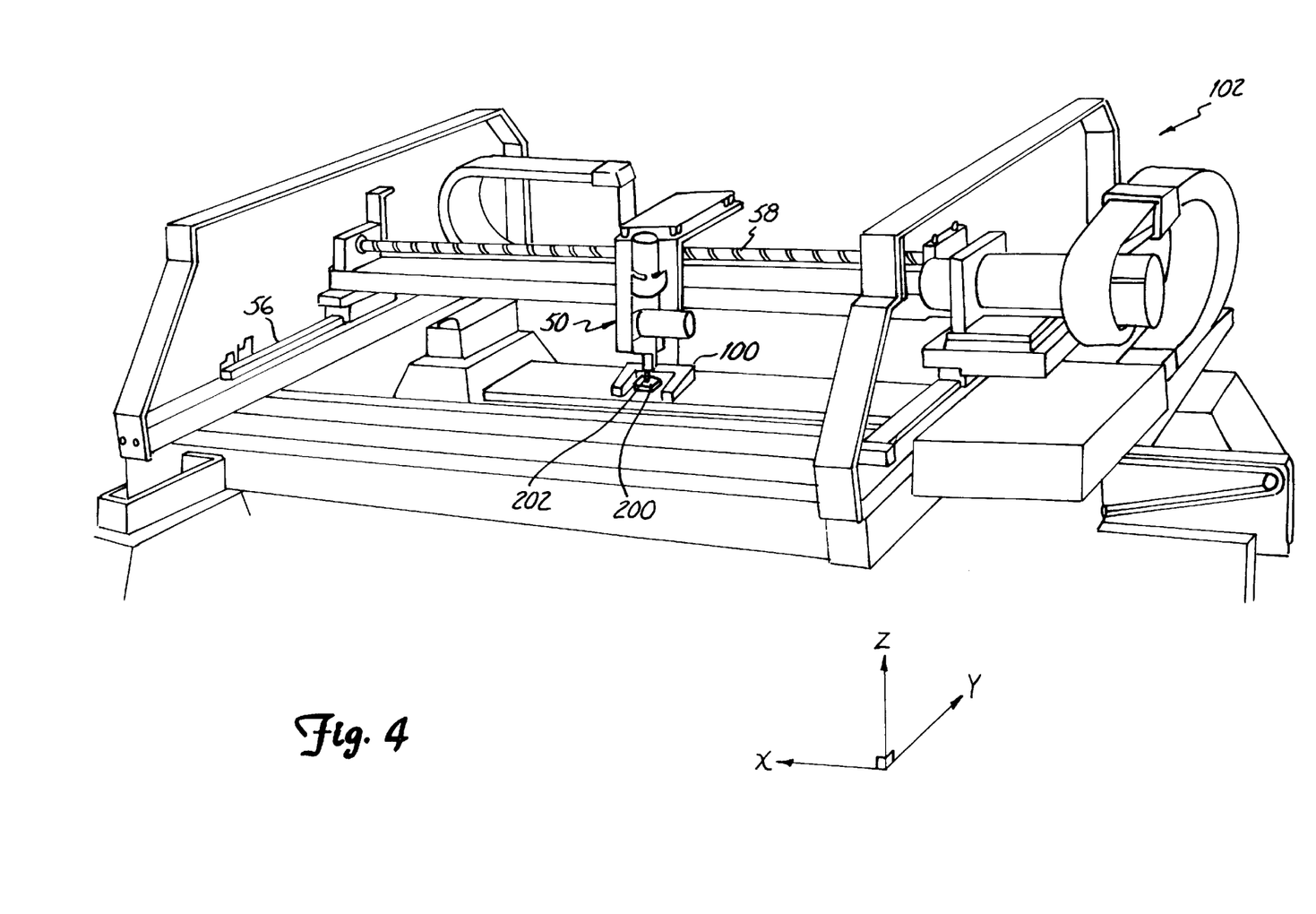
FIG. 4 is sketch of a pick and place of the present invention.

Sensor 100 is shown in pick and place machine 102 pictorially in FIG. 4. Sensor head 50 includes vacuum nozzle 202 for picking up component 200. Sensor 100 is shown configured to be able to shine light onto component 200 and to detect it within the same housing, but it will be understood that the present invention is not limited to the explicit configuration of sensor 100 as shown. For example, other configurations of the light source with respect to the detector electronics may be implemented, but will be understood to be within the scope of the present invention. A conveyor system (not shown) transports a printed circuit (PC) board (not shown) into and out of machine 102. Sensor head 50 is linearly translatable in three directions (x, y, z) and is capable of angularly rotating component 200 via motion control system 108. In pick and place machine 102, each motor runs independently from the other motors by turning a threaded shaft which causes head 50 to slide along an appropriate gantry or slide, (x, y) gantries or slides shown respectively at reference designator 56 and 58. The pick and place machine of the sort shown in FIG. 2 is typically called a lead screw pick and place machine, although other sorts of pick and place machines may be utilized in the method and apparatus of the present invention, such as those with valves or linear motors rather than lead screws.

Figure 5:
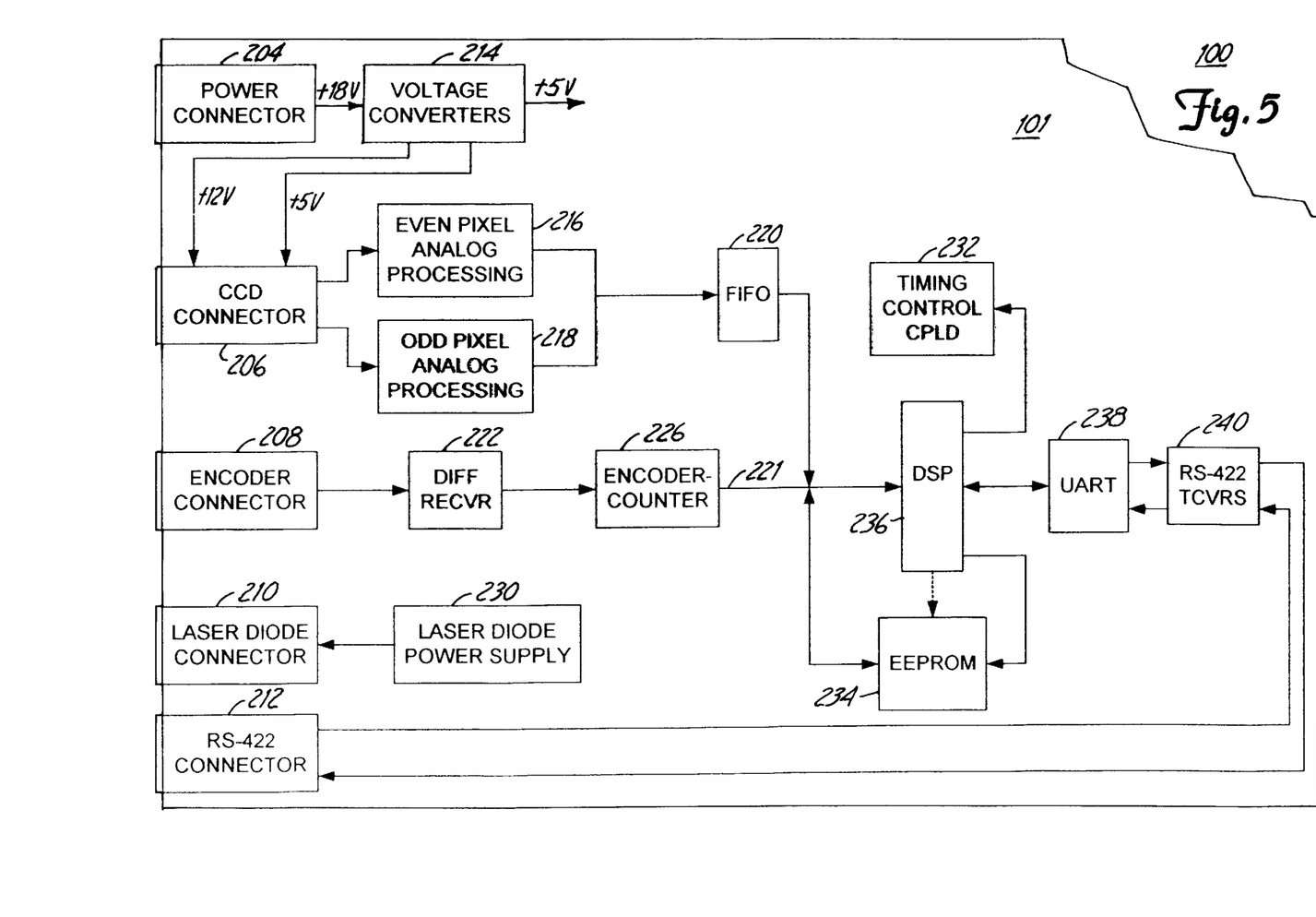
FIG. 5 is a detailed block diagram of the electronics in the sensor of the present invention.

FIG. 5 is a detailed electrical block diagram of sensor 100. The main electronics board within sensor 100 has several connectors, although it is understood that the other embodiments may combine functionality within the electronics in a variety of ways. A power connector 204 is intended to connect to power supply 110 via cabling 106. A voltage converter circuit 214 provides appropriate power to all of the circuits on electronics board 101, in the form of converters from the plus 18 volt supply voltage to dual supply voltages of plus 5 Volts and plus 12 Volts.

A CCD connector 206 is intended to connect to CCD detector 54 within sensor 100. Two channel analog processing circuits 216, 218 are shown, since detector 54 is of the sort which provides dual outputs, to provide faster image read-out from the CCD detector. A FIFO circuit 220 combines output from the dual circuits 216, 218 and sends data representative of the intensity of the image collected in detector 54 to a digital signal processor (DSP) 236 over a common data bus 221.

An encoder connector 208 connects to bidirectional bus 104, which receives pulse width encoded positional information from encoder 140 and provides a digital signal via encoder counter circuit 226 through differential receiver 222. Encoder counter 226 appropriately counts the number of pulses that have been received. A pair of circuits 222,226 is used for each channel. For example, in the embodiment shown in FIG. 6A, four pairs of differential receivers and encoders are required because there are four data channels in sensor 100. Encoder 140, which encodes the θ position of rotational motor 132, has a frequency output as a function of angle and the phase of the two clocks coming from the encoder to indicate which direction motor 132 is turning nozzle 202. A laser diode connector 210 receives power and provides a stand alone laser diode power supply for laser diode 52 within sensor 100.

An RS-422 connector 212 receives commands and their associated data from host processor 122 over cabling 104, except for power supply 34, and allows data from sensor 100 to be transmitted to processor 122. Any other standardized protocol may be implemented on cabling 104, but in order to maintain the interchangeability of the present sensor, it is preferable that the connection be serial, since most parallel protocols requires some degree of specificity for a particular product. The desired placement position of component 200 is sent from host 122 to DSP 236 through connector 212.

A timing control circuit CPLD 232 (complex programmable logic device) provides the clocking signals required for the operation of the CCD 206, the analog processing units 216,218 and FIFO memory 220, and also provides device decoding logic and control signals for connecting DSP 236 to the different devices such encoder counter 226, FIFO 220, UART 238 and EEPROM 234. DSP 236 is responsible for all data acquisition and processing in sensor 100, and includes a built-in storage of image data and other temporary information. The program required for operating DSP 236 is stored in non-volatile EEPROM 234, which also stores calibration and configuration data.

A set of laser aligned functions which DSP 236 performs is shown below in Table 1.

TABLE 1

Perform alignment processing for one component
Read results of alignment processing
Load configuration parameters
Read operation and calibration parameters
Read raw image data
Read part width v. rotational angle data
Perform sensor diagnostic routines
Preset encoder-counters The digitized image data from detector 54 is stored by the DSP in its internal memory and from such stored data, DSP 236 computes the orientation θ and offsets (x,y) of component 200 with respect to some standard reference point. DSP 236 operates on the desired position signal from machine 102, and the orientation information computed by DSP 236, to compute a correction signal representative of the amount of x,y and θ movement correction which must be accomplished in order to place component 200 in the desired placement spot.

A set of receiver/transmitter circuits 238, 240 send and receive data from and to connector 212. The data is transmitted serially, according to a prescribed standard (e.g., RS-422) to provide fully interchangeable sensors regardless of manufacturer or type, as well as to minimize the number of connections between the sensor and the pick and place machine.

Figures 6A, 6B, 6C:
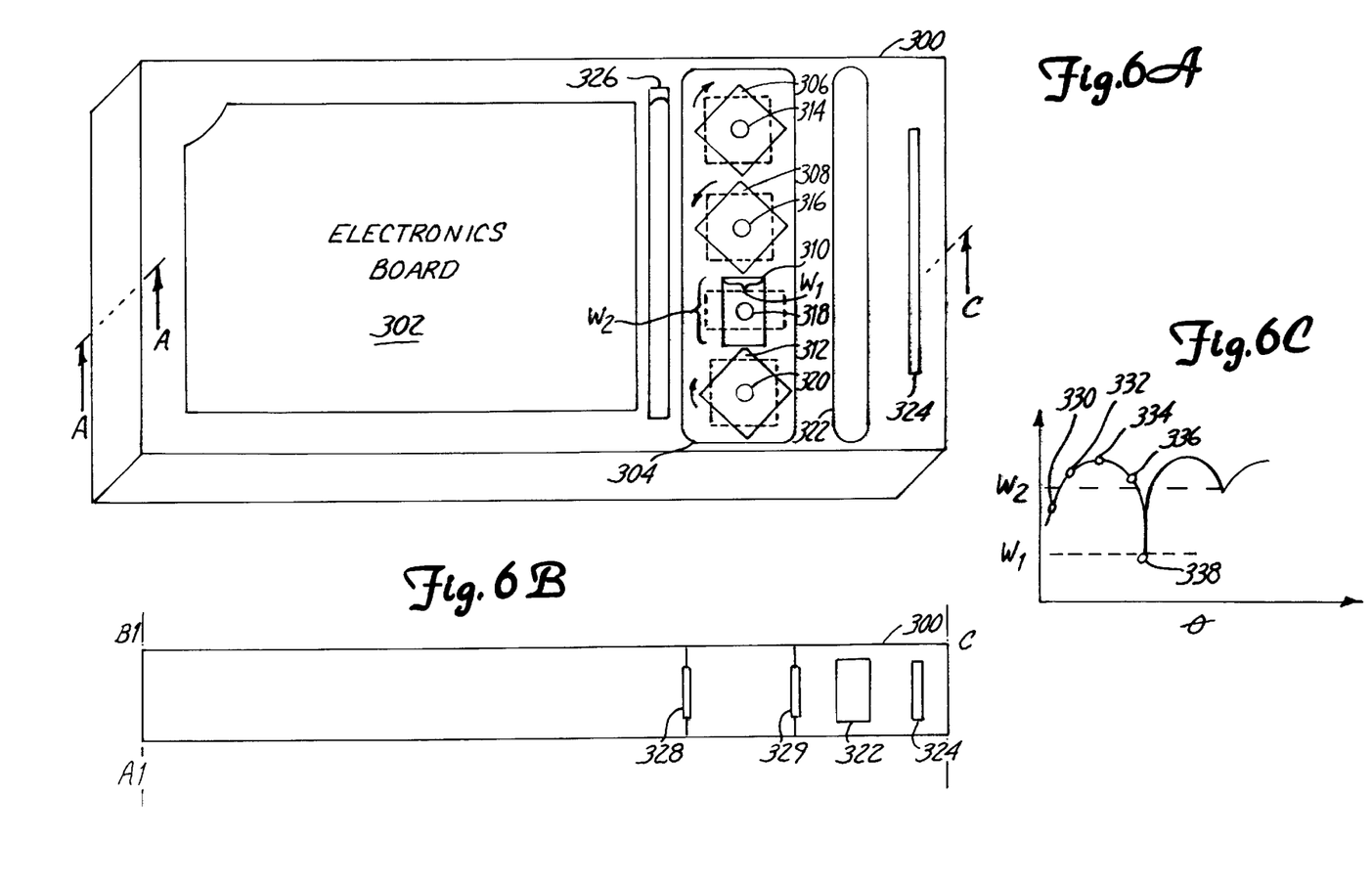

A preferred embodiment of shadow cast sensor system 100 is shown at FIG. 6A–E, where a single sensor housing 300 includes four separate channels, each channel adapted to sense the x,y,θ orientation of one of four components. Sensor housing 300 contains an electronics board 302 (not shown), and an opening 322 through housing 304. Opening 304 is adapted for use with at least four components, FIG. 6A showing components 306, 308, 310, 312 secured to a nozzle 314, 316, 318, 320, respectively. In general, the width of slot 304 is at least 80 millimeters long in order to accommodate four nozzles with 17 mm spacing, where any nozzle can handle a component which may be as large as 35 mm diagonally. Condenser optics 322 act to condense the shadow images of the components projected through slot 304 onto a CCD detector 324, in order to allow use of a detector 324 which is narrower than the field of view. Detector 324 is typically a Sony ELX 510 CCD array detector which consists of a linear array of 5150 pixels, with a pixel pitch and height, respectively, of 7 microns. The width of the entire array 324 is approximately 36 millimeters. A laser diode or any other sort of light source, including incoherent light sources, is positioned at 326 in order to shine collimated light through a window slot 326 onto components 306–312. The shadows formed by the components blocking the light from the light source 326 is focused through optics 322 and onto detector 324. Sectional view FIG. 6B shows a cross sectional view of the interior of sensor 300, including two optical windows 328,329 which prevent dust particles and the like from entering housing 300.

Figure 6D:
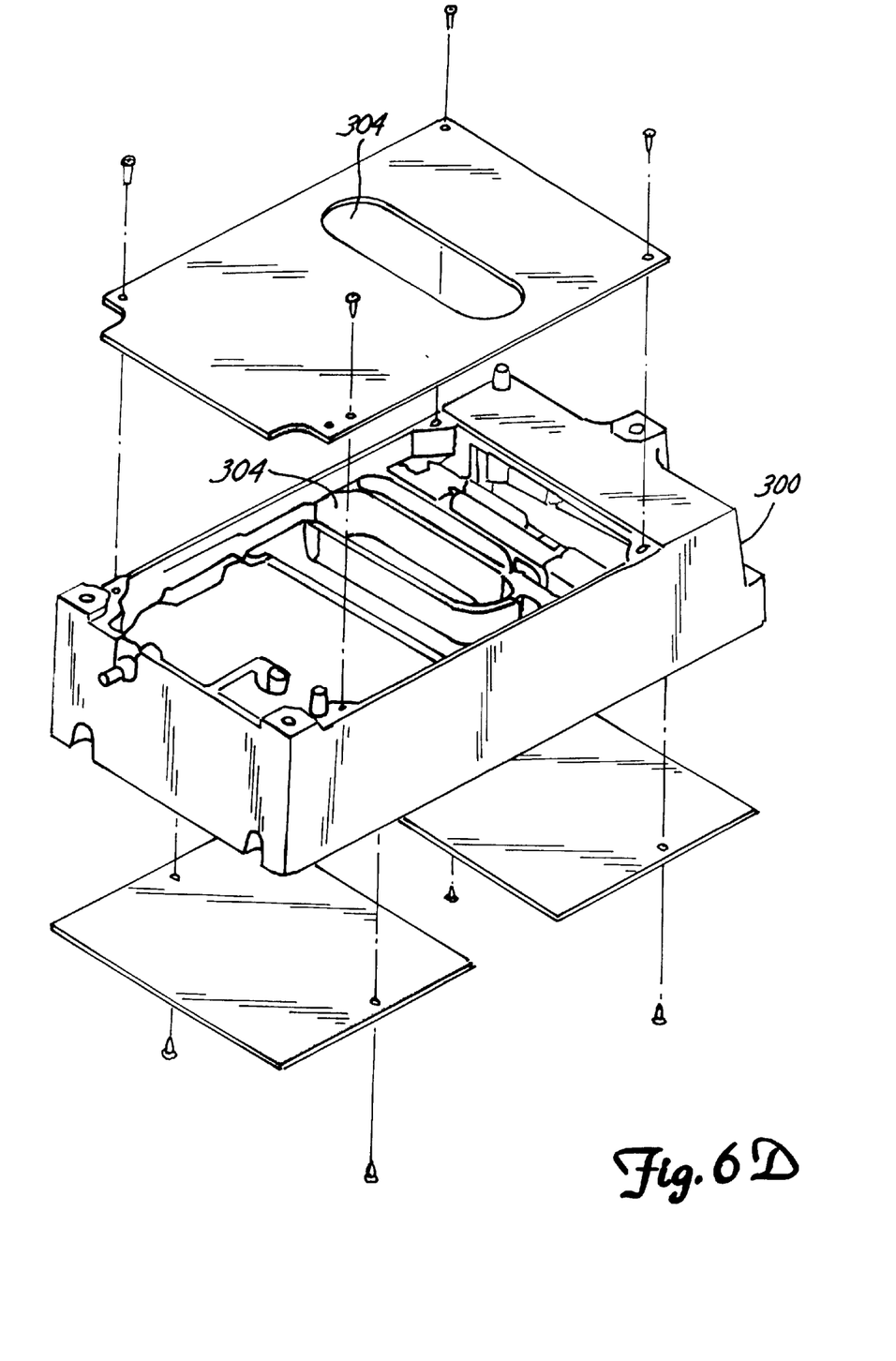
FIG. 6D showing an exploded drawing of the sensor.

The electronics shown in FIG. 5 apply to sensor 300, except that encoder connector 208 receives four channels of rotating encoder output from motors driving the four nozzles 314–320 in FIG. 6A. (Each of the four channels corresponds to one of the four components 306–312.) DSP 236 provides image acquisition, data processing, communicating to the pick and place host machine and control for sensor 300, including the basic command set shown in Table 1. Three useful parameters reported from sensor 300 are the rotational angle, θ, corresponding to the alignment of a major width of the component with the x or y axis of the pick and place machine, the center of the shadow cast from the component at a preselected value of θ and the width of the shadow cast from the component at a preselected value of θ. In particular, the center measurement is effective for use by machine 102 in determining the offset of the pickup point (the center of the nozzle when the component is secured to the nozzle) from the actual center of the component. In particular, if a shadow cast on detector 324 is between points $x_2$ and $x_1$, the center is the average of the two points being:

$$c=(x_2+x_1)/2-x_0$$

where $x_0$ is a constant derived from an installation process of the sensor in the beginning of operation and $x_2$ and $x_1$ are derived the actual shadow of the component on detector 324. Similarly, the component width is equivalent to the difference between points $x_2$ and $x_1$, and once reported to the pick and place machine, is useful in verifying the type of part of which is to be placed, whether the part which is being measured is the correct part, or whether the correct part has been improperly picked up on the wrong side. FIG. 6C shows a plot of the width of a shadow cast on detector 324 while component 310 is rotated. Shadow width data points 330–338 are collected at different angle θs, and the results may be viewed via operator interface 120 in this graphical form. The first minimum on the plot in FIG. 6C corresponds to the minor dimension, $w_1$ (width) of component 310 and the second minimum on the plot corresponds to a major dimension, $w_2$ (length) of the same component. Optionally, DSP may also compute and send to machine 102 a signal representative of the quality of the laser stripe, by differencing the intensity of the pixels on the detector in the presence and absence of a component so as to indicate that dirt or some other optical obstruction is present on detector windows 328,329. Such information is helpful to schedule proper maintenance of sensor 300. FIG. 6D shows an exploded drawing of sensor 300, which shows slot 322, which is long enough to allow for four components. The optical components within sensor 300 are located to the right of slot 322 in FIG. 6D, and the electronics and detector are located to the left of slot 322.

The additional function performed by the DSP in the present invention is to compute a correction signal representative of the amount of x,y and θ movement correction required to place a component, as a function of the desired position signal from machine 102, and the orientation information computed by DSP 236. The present invention allows for direct communications between standalone sensor 300 and pick and place machine 102 using twisted wire pairs. The communications protocol between pick and place machine 102 and sensor 100 is similar to that used on presently available laser aligned sensors and can use RS-232 or 422 interface, as appropriate, so that one type of sensor 300 may be exchanged for another type without removing an electronics board from machine 102.

The four channel system of the present invention, allows for a shadow cast sensor system with improved maintenance and interchangeability. With the interchangeable sensor of the present invention, unnecessary maintenance in the pick and place machine, and related downtime is obviated and multiple shadow cast sensors, regardless of manufacture, can be swapped in and out by merely changing the sensor and connecting cables from the sensor to connectors on the exterior of the pick and place machine.

Although the present invention has been described with reference to preferred embodiments, workers skilled in the art will recognize that changes can be made in form and detail without departing from the spirit and scope of the invention. For instance, insubstantial changes in the organization of the electronics, as well as nominal changes to the optical portions of the sensor or the pick and place machine should not be construed to change the essence of the invention. Finally, the present invention is not limited to use in the area of pick and place machines, but may be used in surface profiling, printed circuit inspection systems, solder paste inspection systems, component placement systems in general, vision assisted laser trimming and final assembly inspection systems which utilize shadow cast sensors.

What is claimed is:

1. A method of positioning a component in a desired position on a board, the method comprising the steps of:
   a) picking up the component with a nozzle on a pick and place machine;
   b) transporting the component towards the board as a function of the desired position;
   c) sensing an orientation of the component with respect to the nozzle and computing a correction instruction, the sensing and the computing carried out in a sensor;
   d) communicating the correction instruction to the pick and place machine; and
   e) placing the component as a function of the correction instruction.

2. A method of positioning a component in a desired position on a board, the method comprising the steps of:
   a) picking up the component with a nozzle on a pick and place machine;

b) transporting the component to a fixedly located station for inspection;

c) sensing an orientation of the component with respect to the nozzle and computing a correction instruction, the sensing and the computing carried out in a sensor;

d) communicating the correction instruction to the pick and place machine; and e) placing the component as a function of the correction instruction.

3. A sensor for generating a correction signal to a pick and place machine, the sensor fixedly mounted on a nozzle of the pick and place machine, the nozzle and the sensor configured to move relative to a component conveyor system, the sensor comprising:

a receive circuit in the sensor coupled to the pick and place machine configured to receive rotational data about the rotational position of the nozzle;

optics and detection electronics in the sensor configured to detect the position of a component fixedly attached to the nozzle and provide a position signal representative of the position of the component; and a signal processing circuit in the sensor configured to process the positional signal from the optics as a function of the rotational data, the signal processing circuit further configured to output the correction signal to the pick and place machine.

4. A sensor for sensing the position of a component removedly attached to a nozzle, the nozzle adapted to rotate the component to a plurality of rotational positions while light shines on the component, the sensor and the nozzle configured to move relative to a conveyor system, the sensor comprising:

a sensor housing;

a detector in the housing receiving the light, the detector configured to provide an output representative of a profile of the component;

a receive circuit in the housing coupled to an encoder, the encoder configured to provide an output representative of the rotational position of the nozzle; and computing circuitry in the housing adapted to compute a width of the profile at the plurality of rotational positions as a function of the output from the encoder and output from the detector, the circuitry further adapted to provide a value of the output of the encoder at which the width of the component is minimized.

5. The sensor of claim 4 where the sensor further comprises a light source.

6. The sensor of claim 5 where the light source outputs substantially coherent light.

7. The sensor of claim 5 where the light source is a diode.

8. The sensor of claim 5 where the light source is a laser diode.

9. The sensor of claim 5 where the light source outputs substantially incoherent light.

10. The sensor of claim 4 where the motor encoder is located outside of the housing.

11. The sensor of claim 4 where the computing circuitry is a digital signal processing circuit.

12. The sensor of claim 11 where the computing circuitry further comprises a EEPROM for storing constants related to the calibration and configuration of the sensor.

13. The sensor of claim 4 further comprising a UART coupled to the computing circuitry, the UART serially transmitting information representative of the physical position of the component.

14. The sensor of claim 4 where the housing is adapted to receive at least one additional component, the component removedly attached to an additional nozzle.

15. The sensor of claim 14 where the housing is adapted to receive four components.

16. The sensor of claim 4 wherein the serial transmission is in accordance with the RS 232 standard.

17. The sensor of claim 4 including a power input configured to receive power to power the detector, the receive circuit and the computing circuitry.

18. The sensor of claim 4 wherein the computing circuitry includes a digital signal processor.

19. The sensor of claim 4 wherein the computing circuitry includes a memory configured to store a captured image of the component.

* * * * *